(12) United States Patent
Chen et al.

(10) Patent No.: US 10,490,525 B1
(45) Date of Patent: Nov. 26, 2019

(54) HIGH SPEED HANDLING OF ULTRA-SMALL CHIPS BY SELECTIVE LASER BONDING AND DEBONDING

(71) Applicant: International Business Machines Corporation, Armonk, NY (US)

(72) Inventors: Qianwen Chen, Yorktown Heights, NY (US); Bing Dang, Chappaqua, NY (US); Russell Budd, North Salem, NY (US); Bo Wen, New York, NY (US); Li-Wen Hung, Mahopac, NY (US); Jae-Woong Nah, Closter, NJ (US); John Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/976,319

(22) Filed: May 10, 2018

(51) Int. Cl.
*H01L 21/44* (2006.01)
*H01L 21/48* (2006.01)
(Continued)

(52) U.S. Cl.
CPC .......... *H01L 24/75* (2013.01); *H01L 21/6835* (2013.01); *H01L 24/799* (2013.01); *H01L 24/81* (2013.01); *H01L 24/95* (2013.01); *H01L 24/98* (2013.01); *H01L 25/50* (2013.01); *H01L 2221/68322* (2013.01); *H01L 2221/68381* (2013.01); *H01L 2224/7598* (2013.01); *H01L 2224/75261* (2013.01); *H01L 2224/75753* (2013.01); *H01L 2224/75804* (2013.01); *H01L 2224/75901* (2013.01);
(Continued)

(58) Field of Classification Search
CPC ... H01L 21/6835; H01L 24/75; H01L 24/799; H01L 24/81; H01L 24/95
USPC .......................................................... 438/108
See application file for complete search history.

(56) References Cited

U.S. PATENT DOCUMENTS

| 6,046,076 A * | 4/2000 | Mitchell ................. H01L 21/56 |
| | | 438/127 |
| 8,334,152 B2 | 12/2012 | Speier |
| (Continued) | | |

OTHER PUBLICATIONS

Andry et al., "Advanced Wafer Bonding and Laser Debonding," Electronic Components and Technology Conference (ECTC), 2014 IEEE 64th (May 2014).

*Primary Examiner* — David S Blum
(74) *Attorney, Agent, or Firm* — Daniel P. Morris; Michael J. Chang, LLC

(57) ABSTRACT

Techniques for high speed handling of ultra-small chips (e.g., micro-chips) by selective laser bonding and/or debonding are provided. In one aspect, a method includes: providing a first wafer including chips bonded to a surface thereof; contacting the first wafer with a second wafer, the second wafer including a substrate bonded to a surface thereof, wherein the contacting aligns individual chips with bonding sites on the substrate; and debonding the individual chips from the first wafer using a debonding laser having a small spot size of about 0.5 μm to about 100 μm, and ranges therebetween. A system is also provided that has digital cameras, a motorized XYZ-axis stage, and a computer control system configured to i) control a spot size of the at least one laser source and ii) adjust a positioning of the sample to align individual chips with a target area of the laser.

16 Claims, 17 Drawing Sheets

(51) Int. Cl.
*H01L 21/50* (2006.01)
*H01L 23/00* (2006.01)
*H01L 21/683* (2006.01)
*H01L 25/00* (2006.01)

(52) U.S. Cl.
CPC ......... *H01L 2224/7999* (2013.01); *H01L 2224/81005* (2013.01); *H01L 2224/8116* (2013.01); *H01L 2224/81132* (2013.01); *H01L 2224/81224* (2013.01); *H01L 2224/81815* (2013.01); *H01L 2224/95001* (2013.01); *H01L 2224/95121* (2013.01); *H01L 2224/95148* (2013.01); *H01L 2224/98* (2013.01); *H01L 2924/12041* (2013.01); *H01L 2924/1421* (2013.01)

(56) References Cited

U.S. PATENT DOCUMENTS

| | | | |
|---|---|---|---|
| 9,735,077 B1 | 8/2017 | Chen et al. | |
| 10,217,637 B1* | 2/2019 | Budd | H01L 21/2007 |
| 2014/0103499 A1* | 4/2014 | Andry | H01L 21/6835 |
| | | | 257/644 |
| 2017/0200711 A1 | 7/2017 | Uzoh et al. | |
| 2017/0236267 A1 | 8/2017 | Negishi et al. | |
| 2017/0256523 A1 | 9/2017 | Huska et al. | |
| 2019/0194453 A1* | 6/2019 | Liu | C08L 71/12 |

\* cited by examiner

US 10,490,525 B1

HIGH SPEED HANDLING OF ULTRA-SMALL CHIPS BY SELECTIVE LASER BONDING AND DEBONDING

FIELD OF THE INVENTION

The present invention relates to chip handling techniques, and more particularly, to high speed handling of ultra-small chips (e.g., micro-chips) by selective laser bonding and/or debonding.

BACKGROUND OF THE INVENTION

During fan-out wafer-level packaging (FOWLP), individual chips are precisely placed on a (reconstituted) thin wafer substrate. A mold is formed over the reconstituted wafer substrate, followed by a redistribution layer (RDL) and a solder layer.

Pick-and-place machines operate by placing electronic components (such as chips, capacitors, resistors, etc.) sequentially, one after another, onto a substrate. With high-speed auto alignment and positioning equipment, a pick-and-place machine can efficiently achieve reconstituted wafers with chip sizes of 10× millimeters (mm) in minutes. However, with micro-chip components (e.g., chip size of only 10× micrometers (μm)), it can take hundreds of hours to get a reconstituted 12-inch wafer via pick-and-place processing.

Further, high placement accuracy is always desired in wafer reconstitution, which makes the process even slower. High placement accuracy ensures that the lithography opening of the follow-on dielectric, redistribution and solder layers occurs at the proper locations. Thus, the wafer reconstitution process for micro-chips is time-consuming, affecting the throughput and cost performance of the fan-out package.

Pick-and-place processing typically employs vacuum nozzles of various sizes for handling/gripping components. However, due to the ultra-small sizes and reduced thicknesses of micro-chip components, it is a challenge to provision a suitable vacuum nozzle for reliable assembly. Namely, once chips are less than 300 micrometers (μm), handling and stiction can become a problem due to the gravitational force as compared to the surface forces. Further, the down-force of the nozzle can easily crack thin chips during placement on the substrate.

Therefore, with the miniaturization of circuit components and electronic devices, there is a need for efficient and effective high-speed precision handling solutions of micro-chips for FOWLP and other heterogeneous integration applications.

SUMMARY OF THE INVENTION

The present invention provides techniques for high speed handling of ultra-small chips (e.g., micro-chips) by selective laser bonding and/or debonding technology in wafer-level processes. In one aspect of the invention, a method includes: providing a first wafer including chips (e.g., micro-chips) bonded to a surface thereof; contacting the first wafer with a second wafer, the second wafer including a substrate bonded to a surface thereof, wherein the contacting aligns individual chips with bonding sites on the substrate; and debonding the individual chips from the first wafer using a debonding laser having a small spot size of about 0.5 μm to about 100 μm, and ranges therebetween.

In another aspect of the invention, a system includes: at least one optical scanner; at least one laser source optically connected to the at least one optical scanner, wherein the at least one laser source is configured to produce one or more of a bonding laser and a debonding laser; digital cameras optically connected to the at least one optical scanner; a motorized XYZ-axis stage; a sample on the motorized XYZ-axis stage, wherein the sample comprises a first wafer having chips bonded to a surface thereof in contact with a second wafer having a substrate bonded to a surface thereof; and a computer control system configured to i) control the at least one laser source, ii) read image information from the digital cameras to calculate alignment position; and iii) adjust a position of the motorized XYZ-axis stage to align individual chips with a target area of the at least one laser source.

A more complete understanding of the present invention, as well as further features and advantages of the present invention, will be obtained by reference to the following detailed description and drawings.

DETAILED DESCRIPTION OF PREFERRED EMBODIMENTS

Figure 1:
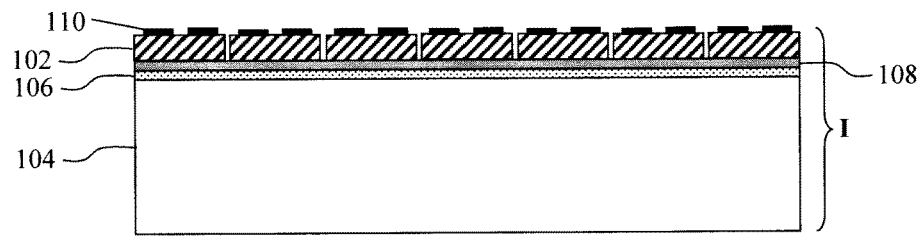
FIG. 1 is a cross-sectional diagram illustrating a first (I) wafer having a plurality of chips (e.g., micro-chips) bonded to a transparent handle wafer via a release layer and an adhesive layer according to an embodiment of the present invention.

Provided herein are techniques for high-speed precision handling of micro-chips for fan-out wafer-level packaging (FOWLP) and other heterogeneous integration applications. The term "micro-chip," as used herein, refers to a chip with a substrate that is less than 100 micrometers ($\mu m$)×100 $\mu m$. For instance, radio-frequency identification (RFID) chips typically have substrate dimensions of about 40 $\mu m$×40 $\mu m$, and light-emitting diode (LED) chips typically have substrate dimensions of about 8 $\mu m$×8 $\mu m$. Thus, RFID and LED chips are considered herein to be micro-chips.

As will be described in detail below, the present techniques employ a precise laser and optical guide system to selectively place micro-chips on a thin, flexible substrate from a handle wafer. In one exemplary embodiment, a template wafer is employed to focus a (large spot size) laser beam precisely onto specific locations on the handle wafer to release single micro-chips from the handle wafer. In another exemplary embodiment, the template wafer is replaced by a digital vision system and a programmable laser beam (e.g., with programmable spot size) along with a motorized stage to precisely target specific micro-chips for release from the handle wafer. In yet another exemplary embodiment, the present techniques are leveraged for both bonding and debonding via a double-sided laser system. Each of these embodiments will be described in detail below.

Laser-based wafer bonding and debonding techniques have been proposed. See, for example, U.S. Patent Application Publication Number 2014/0103499 by Andry et al., entitled "Advanced Handler Wafer Bonding and Debonding" (hereinafter "U.S. Patent Application Publication Number 2014/0103499"), the contents of which are incorporated by reference as if fully set forth herein. See also, Andry et al., "Advanced Wafer Bonding and Laser Debonding," Electronic Components and Technology Conference (ECTC), 2014 IEEE $6^{4th}$ (May 2014) (hereinafter "Andry"), the contents of which are incorporated by reference as if fully set forth herein. The techniques described in U.S. Patent Application Publication Number 2014/0103499 and Andry, however, are not well-suited to selective placement of ultra-small components such as micro-chips. Namely, the spot size of the laser employed is too large to effectively target specific micro-chips for placement. Also, it is not able to locate a target as small as a micro-chip.

Advantageously, the present techniques provide a precision laser tool with optical guide system that enables selective placement of ultra-small components such as micro-chips using ablative debonding techniques. In general, each of the embodiments described herein begins with a plurality of chips (e.g., micro-chips) bonded to a transparent handle wafer via a release layer and an adhesive layer. The adhesive layer bonds to the chips and can be any suitable bonding adhesive known in the art. By way of example only, suitable bonding adhesives include, but are not limited to, polyimide-based adhesives such as are commercially available from HD MicroSystems, Parlin, N.J., thermalplastic adhesive such as are commercially available from Brewer Science, Inc, Benzocyclobutene (BCB), Polymethylmethacrylate (PMMA), and/or Polydimethylsiloxane (PDMS). The release layer is a thin layer that must bind securely to the adhesive layer and the transparent handle wafer, yet later be removable (by laser ablation) to fully release the chips from the transparent handle wafer. Suitable release layer materials include, but are not limited to, benzocyclobutene (BCB), polyimide-based adhesives such as are commercially available from HD MicroSystems, Parlin, N.J., polyimide-based materials, inert underlayer (UL) films, spin-on carbon (SOC) films, and/or organic planarizing layer (OPL). See, for example, Andry. According to an exemplary embodiment, the release layer has a thickness of from about 5 micrometers (μm) to about 10 μm, and ranges therebetween.

The transparent handle wafer is used to place the chips over a thin, flexible substrate for reconstitution. An ultraviolet (UV) laser introduced through the transparent handle wafer, is then used to ablate select portions of the release layer to debond the respective individual chips from the transparent handle wafer. Tool designs are also provided herein where a laser system is also provided opposite the debonding surface to facilitate bonding of the chips to the flexible substrate.

Since the release layer is irradiated through the transparent handle wafer, the transparent handle wafer is formed from a material that readily transmits light. By way of example only, suitable materials for the transparent handle wafer include, but are not limited to, glass and/or silicon (which is semi-transparent to near IR lasers). Suitable flexible substrates include, but are not limited to, glass substrates, polymer substrates (such as polyimide substrates), and/or ceramic substrates (such as zirconium oxide, aluminum oxide and/or titanium dioxide). The flexible substrate is preferably thin. For example, according to an exemplary embodiment, the flexible substrate has a thickness of from about 30 micrometers (μm) to about 50 μm, and ranges therebetween. As will be described in detail below, the flexible substrate can also be bonded to a handle wafer, e.g., via a release layer and an adhesive layer. That way, following chip placement the flexible substrate can be easily debonded from its handle wafer via ablation of the release layer. By way of example only, suitable laser sources for debonding and bonding include, but are not limited to, 355 nanometer (nm) diode-pumped solid state (DPSS) lasers, yttrium aluminum garnet (YAG) lasers, excimer lasers such as xenon fluoride (XeF) or xenon chloride (XeCl) excimer lasers, and/or near-infrared (IR) lasers (800 nm).

A first exemplary embodiment of the present techniques is now described by way of reference to FIGS. 1-5 which illustrate an exemplary chip laser debonding process. In this exemplary embodiment, a template wafer is placed over the transparent handle wafer. The template wafer contains a pattern that permits light incident thereon to pass through only select areas of the template wafer, i.e., those areas aligned with the select micro-chips for debonding.

As shown in FIG. 1, the process begins with a plurality of chips 102 (e.g., micro-chips) bonded to a transparent handle wafer 104 via a release layer 106 and an adhesive layer 108. As provided above, the adhesive layer 108 bonds to the chips 102, and the release layer 106 is a thin layer (e.g., having a thickness of from about 5 μm to about 10 μm, and ranges therebetween) that binds securely to the adhesive layer 108 and the transparent handle wafer 104, yet is later removable (by laser ablation) to fully release the chips 102 from the transparent handle wafer 104. Suitable adhesive and release layer materials were provided above. As shown in FIG. 1, each chip 102 includes bond pads 110 which will later be joined, via solder bonds, to corresponding contact pads on a flexible substrate during reconstitution. The structure shown in FIG. 1 is a first (I) wafer component in the instant process. Although not explicitly shown, deep reactive ion etching (DRIE) or any other standard singulation process can be employed to etch the adhesive layer 108 from the front-side to enable the subsequent release of individual chips 102 by ablation.

Figure 2:
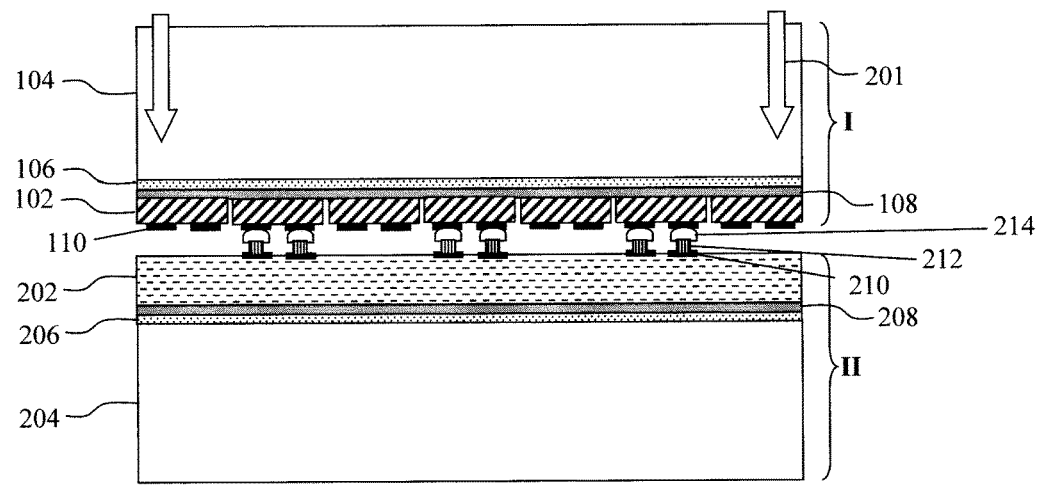
FIG. 2 is a cross-sectional diagram illustrating the first (I) wafer having been flipped such that the chips are facing downward, and the first (I) wafer having been brought in contact with a second (II) wafer having a flexible substrate bonded to a surface thereof aligning individual chips with bonding sites on the flexible substrate according to an embodiment of the present invention.

As shown in FIG. 2, the first (I) wafer is then flipped such that the chips 102 are now facing downward. Namely, by comparison with the orientation depiction in FIG. 1 where the chips 102 are above the transparent handle wafer 104, in FIG. 2 the wafer is flipped with the chips 102 now being below the transparent handle wafer 104. Notably, the bond pads 110 of the chips 102 are also facing downward.

As indicated by arrows 201, the first (I) wafer is then brought in contact with a second (II) wafer component. According to an exemplary embodiment, the second (II) wafer component includes a flexible substrate 202 bonded to a handle wafer 204. Suitable flexible substrates were provided above. According to an exemplary embodiment, the flexible substrate 202 has a thickness of from about 30 μm to about 50 μm, and ranges therebetween. By way of example only, the handle wafer 204 can be a glass, plastic or semiconductor handle wafer. In one exemplary embodiment, the flexible substrate 202 is bonded to the handle wafer 204 via a release layer 206 and an adhesive layer 208. Suitable adhesive and release layer materials were provided above. That way, following placement of the chips 102 on the flexible substrate 202, the handle wafer 204 can then be debonded from the flexible substrate 202 via laser ablation of the release layer 206.

As shown in FIG. 2, the flexible substrate 202 has on an upper surface thereof a plurality of binding sites, namely contact pads 210 and copper (Cu) pillar microbumps (i.e., Cu pillars 212 and tin (Sn)-based microbumps 214, such as nickel (Ni)/copper (Cu)/Sn microbumps). Bringing the first (I) wafer in contact with the second (II) wafer aligns the Cu pillar microbumps with the contact pads 110 on individual downward facing chips 102.

As indicated by arrows 301, a template wafer 302 (which is a third (III) wafer component of the instant process) is then placed over to a side of the first (I) wafer opposite the downward facing chips 102. See FIG. 3. The template wafer 302 includes a pattern 304 on a surface thereof. The pattern 304 has openings 304a above the individual chips 102 that are aligned with the Cu pillar microbumps and which are targeted for debonding. As highlighted above, the notion is that the pattern 304 will permit laser light to pass through only select areas of the template wafer 302, i.e., those areas aligned with the select micro-chips 102 for debonding.

According to an exemplary embodiment, the template wafer 302 is a glass handle wafer, and the pattern 304 is a metal pattern formed on the surface of the template wafer 302 using standard metallization techniques. Suitable patterned metals include, but are not limited to, copper (Cu), nickel (Ni), platinum (Pt), titanium (Ti), and/or tungsten (W). However, any opaque material can be used to form the pattern 304 on the template wafer 302.

Figure 3:
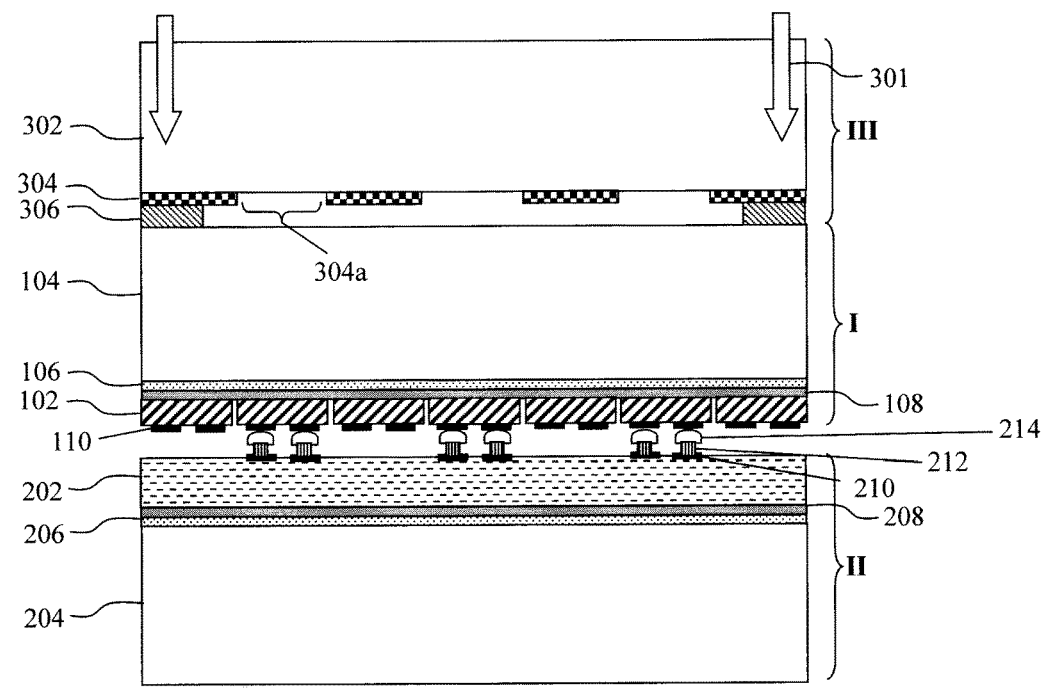
FIG. 3 is a cross-sectional diagram illustrating a template wafer (i.e., a third (III) wafer component) having been placed over to a side of the first (I) wafer opposite the downward facing chips, wherein the template wafer includes a pattern on a surface thereof according to an embodiment of the present invention.

In order to ensure that proper alignment between the template wafer 302/pattern 304 and the first (I) wafer is maintained, the template wafer 302 is preferably affixed in some manner to the first (I) wafer. For instance, according to an exemplary embodiment, an adhesive 306 is used to bond the template wafer 302 to the first (I) wafer. Suitable adhesives include, but are not limited to, polyimide-based adhesives such as are commercially available from HD MicroSystems, Parlin, N.J., thermalplastic adhesive such as are commercially available from Brewer Science, Inc, Benzocyclobutene (BCB), Polymethylmethacrylate (PMMA), and/or Polydimethylsiloxane (PDMS). The adhesive 306 is positioned so as not to obstruct the pattern 304. For instance, as shown in FIG. 3, the adhesive 306 is placed between the outer edges of the wafers, so as not block any of the openings 304a in pattern 304. In practice, however, the adhesive 306 can be placed anywhere between the pattern 304 and the first (I) wafer as long as it does not block any of the openings 304a.

Figure 4:
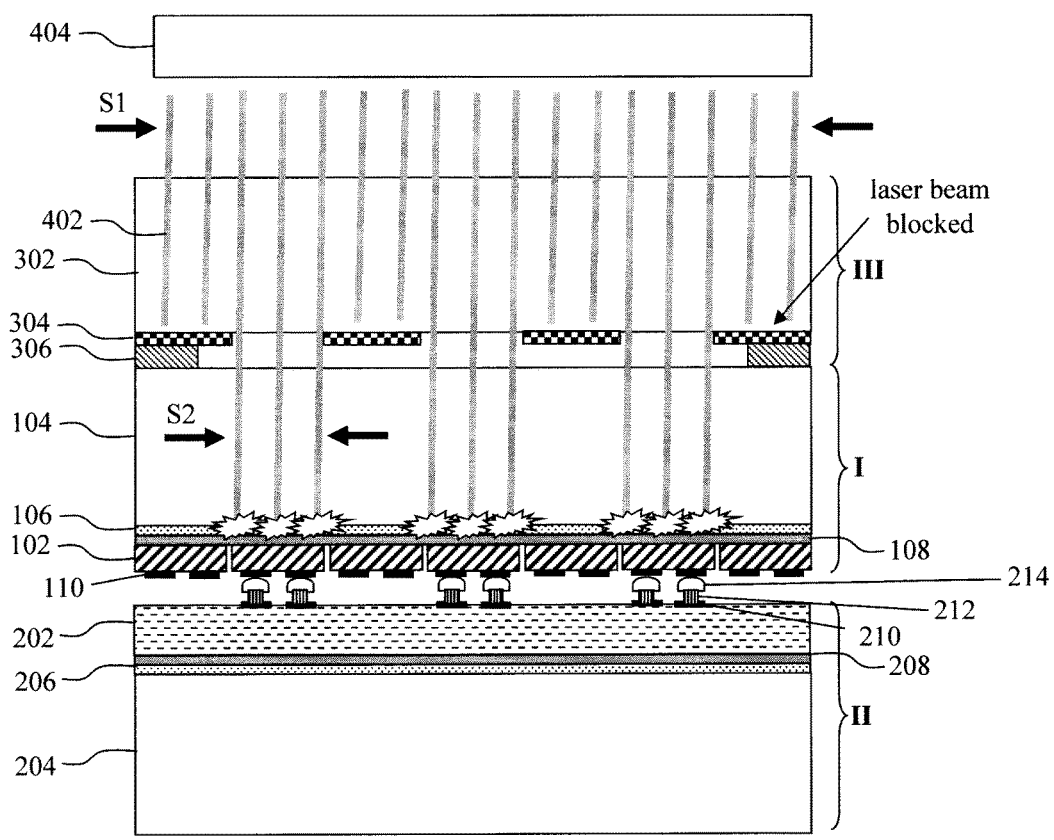
FIG. 4 is a cross-sectional diagram illustrating the first (I) wafer being then irradiated via a laser through the pattern to limit a spot size of the laser according to an embodiment of the present invention.
Figure 5:
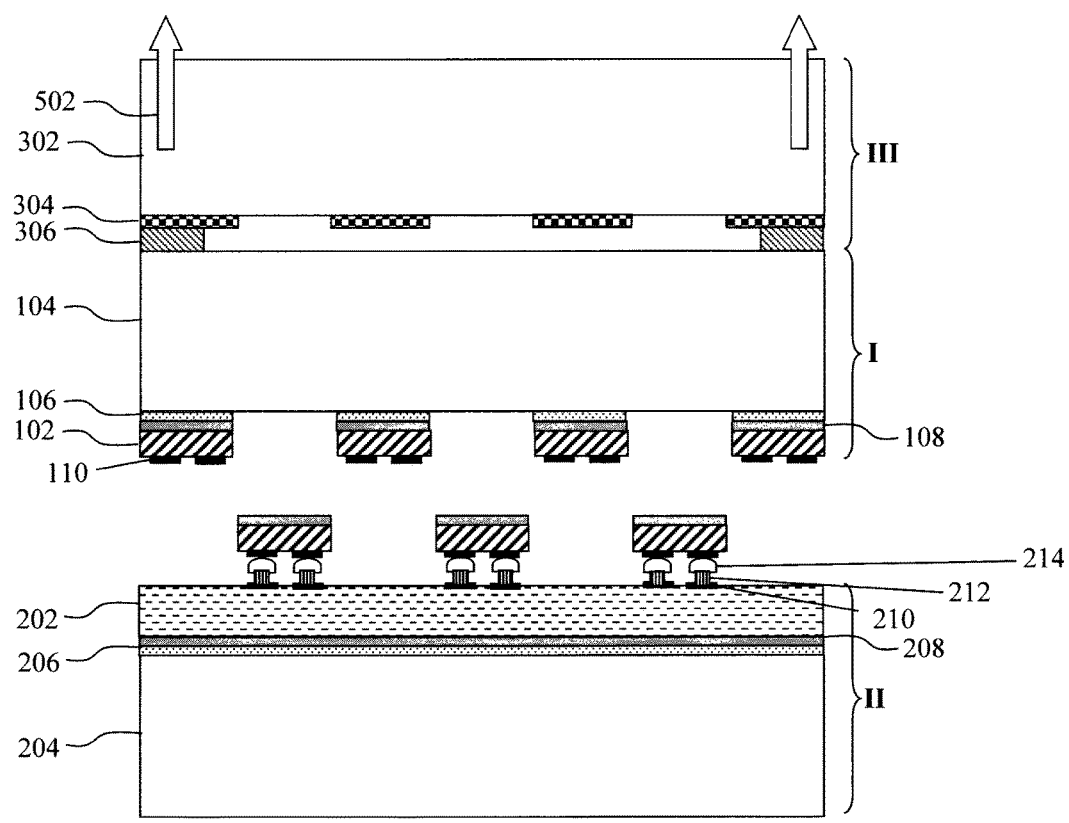
FIG. 5 is a cross-sectional diagram illustrating the first wafer (I)/third (HI) wafer having been separated from the second (II) wafer with the selectively debonded chips remaining on the flexible substrate according to an embodiment of the present invention.

As shown in FIG. 4, the first (I) wafer is then irradiated (via a laser 402 from a laser source 404) through the template wafer 302, whereby the pattern 304 limits the spot size of the laser 402 to only the individual chips 102 over the bonding sites on the substrate 202. Thus, in this exemplary embodiment, it is not necessary to employ a laser source with a controllable/programmable laser beam spot size, since the beam spot size is being controlled via the openings in pattern 304 of the template wafer 302. Namely, as shown in FIG. 4, the template wafer 302 is irradiated with a laser beam having a large spot size S1 (e.g., from about 0.2 millimeters (mm) to about 0.4 mm, and ranges therebetween). However, because of pattern 304, the spot size S2 of the laser beams that pass through the template wafer 302 is smaller, i.e., S2<S1. For example, according to an exemplary embodiment, S2 is from about 0.5 μm to about 100 μm, and ranges therebetween. As provided above, suitable laser sources 404 for debonding include, but are not limited to, 355 nm DPSS lasers, YAG lasers, and/or excimer lasers such as XeF or XeCl excimer lasers.

The smaller spot size (S2) laser beam incident on the first (I) wafer will selectively ablate the release layer 106 over the individual chips 102 effectively debonding those chips from the first (I) wafer. See FIG. 5. Thus, as indicated by arrows 502, when the first wafer (I)/third (III) wafer, i.e., template wafer, are separated from the second (II) wafer, the selectively debonded chips 102 will remain on the flexible substrate 202, while the rest of the chips 102 remain secured to the first (I) wafer.

In another exemplary embodiment, the template wafer is replaced by a digital vision system and a programmable laser beam (e.g., with controllable/programmable spot size) along with a motorized stage to precisely target specific micro-chips for release from the handle wafer. See, for example, FIGS. 6-9 which illustrate another exemplary chip laser debonding process. Like above, this exemplary embodiment begins with a first (I') wafer including a plurality of chips 602 (e.g., micro-chips) bonded to a transparent handle wafer 604 via a release layer 606 and an adhesive layer 608. The adhesive layer 608 bonds to the chips 602, and the release layer 606 is a thin layer (e.g., having a thickness of from about 5 μm to about 10 μm, and ranges therebetween) that binds securely to the adhesive layer 608 and the transparent handle wafer 604, yet is later removable (by laser ablation) to fully release the chips 602 from the transparent handle wafer 604. Suitable adhesive and release layer materials were provided above. Each chip 602 includes bond pads 610 which will later be joined, via solder bonds, to corresponding contact pads on a flexible substrate during wafer reconstitution.

Figure 6:
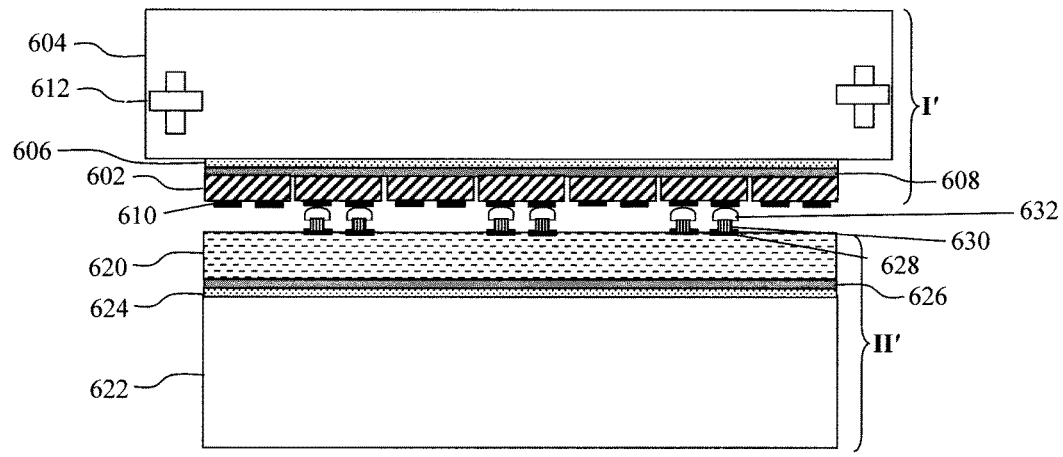
FIG. 6 is a cross-sectional diagram illustrating, according to an alternative embodiment, a first (I') wafer including a plurality of chips bonded to a transparent handle wafer having been brought in contact with a second (II') wafer including a flexible substrate bonded to a surface thereof according to an embodiment of the present invention.
Figure 7:
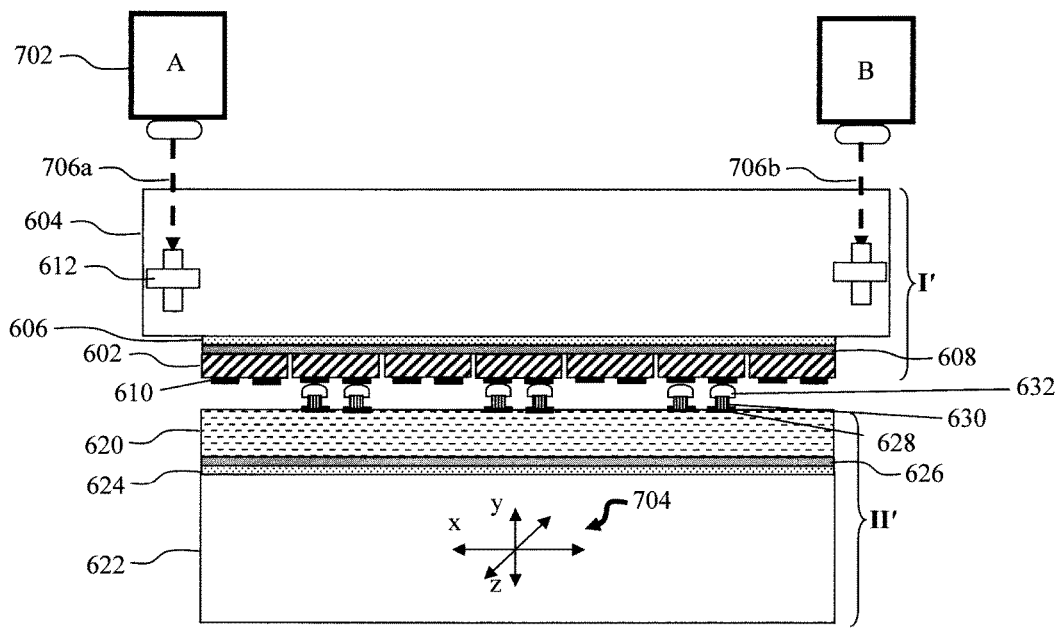
FIG. 7 is a cross-sectional diagram illustrating a digital vision system with digital cameras having been used to align a positioning of the first (I') wafer/second (IF) wafer with a laser target area according to an embodiment of the present invention.

As shown in FIG. 6, the first (I') wafer is oriented such that the chips 602 are downward facing. Namely, after bonding the chips 602 to the transparent handle wafer 604, the wafer can be flipped to position the chips 602 facing downward. In the same manner as above, the first (I') wafer is then brought in contact with a second (II') wafer component. According to an exemplary embodiment, the second (II') wafer includes a flexible substrate 620 bonded to a handle wafer 622. Suitable flexible substrates were provided above. According to an exemplary embodiment, the flexible substrate 620 has a thickness of from about 30 μm to about 50 μm, and ranges therebetween. By way of example only, the handle wafer 622 can be a glass, plastic or semiconductor handle wafer. In one exemplary embodiment, the flexible substrate 620 is bonded to the handle wafer 622 via a release layer 624 and an adhesive layer 626. Suitable adhesive and release layer materials were provided above. That way, following placement of the chips 602 on the flexible substrate 620, the handle wafer 622 can then be debonded from the flexible substrate 620 via laser ablation of the release layer 624.

The flexible substrate 620 has on an upper surface thereof a plurality of binding sites, namely contact pads 628 and Cu pillar microbumps (i.e., Cu pillars 630 and Sn-based microbumps 632, such as Ni/Cu/Sn microbumps). Bringing the first (I') wafer in contact with the second (II') wafer aligns the Cu pillar microbumps with the contact pads 610 on individual downward facing chips 602.

In this exemplary embodiment, a digital vision system will be used to precisely align the laser beam (having a controlled spot size) with the individual chips 602 for debonding by capturing images of alignment marks on the sample. Thus, as shown FIG. 6, fiducial marks 612 are provided. For instance, as shown in FIG. 6 fiducial marks 612 can be located on opposite ends of the transparent handle wafer 604.

According to an exemplary embodiment, the digital vision system includes at least two digital cameras 702, one at a location A and the other at a location B, both cameras 702 facing downward to capture digital images of the first (I') wafer. See FIG. 7. In one exemplary embodiment, the digital cameras 702 are charge-coupled device (CCD) image sensor-based digital cameras.

As indicated by arrows 704, positioning of the sample (i.e., the first (I') wafer/second (II') wafer) is adjusted (e.g., via an automated motorized stage—see below) to align the fiducial marks 612 (via digital cameras 702) with a target area of the laser. The adjustments can be made in several different (e.g., x, y, and z) directions. Namely, adjustments along the x-direction will move the sample to the left or to the right, adjustments along the y-direction will move the sample up or down (i.e., closer or farther away from the laser source (e.g., laser source 802—see below), and adjustments in the z-direction will move the sample into or out of the page. According to an exemplary embodiment, the positioning of the sample is adjusted until the fiducial marks 612 are each captured (see arrows 706a and 706b) by the digital cameras 702 at locations A and B, respectively. It is notable that orientation of the digital cameras 702 relative to the sample is being simplified for ease and clarity of depiction. Namely, as will be described in detail below, various components such as beam splitters and scanners can be employed between the digital cameras 702 and the sample.

Figure 8:
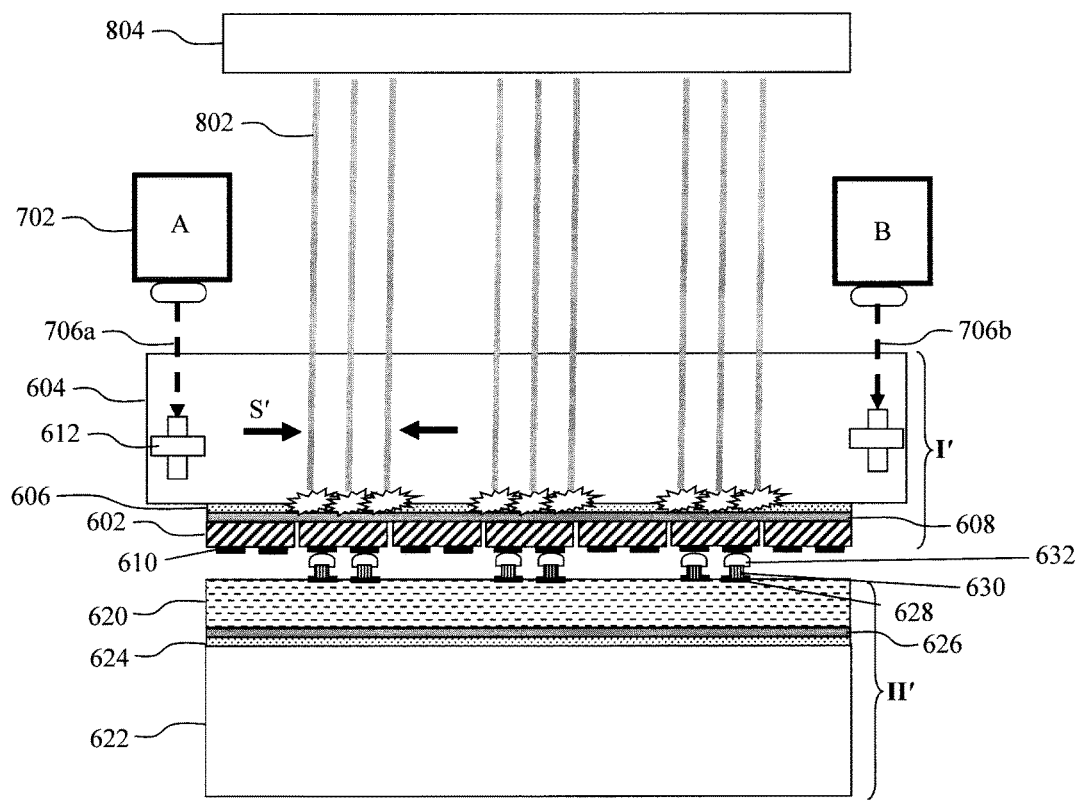
FIG. 8 is a cross-sectional diagram illustrating the first (I') wafer being irradiated via a laser beam from a laser source having a controlled spot size according to an embodiment of the present invention.
Figure 9:
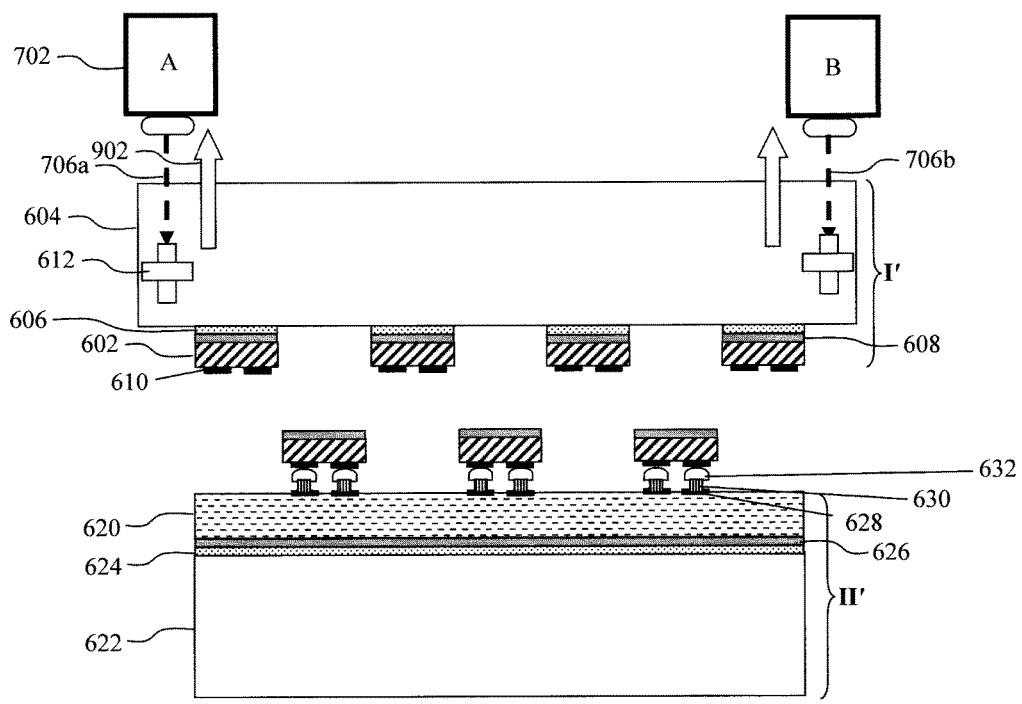
FIG. 9 is a cross-sectional diagram illustrating the first (I') wafer having been separated from the second (II') wafer with the selectively debonded chips remaining on the flexible substrate according to an embodiment of the present invention.

As shown in FIG. 8, the first (I') wafer is then irradiated via a laser beam 802 from a laser source 804. It is notable that the path between the laser 802 and laser source 804 is being simplified in FIG. 8 for ease and clarity of depiction. Namely, as will be described in detail below, various components such as beam expanders, mirrors, lenses, beam splitters, and scanners can be located in the beam path to guide/control the beam spot size, target area, etc. of the laser. For instance, according to an embodiment, the laser beam spot size S' is controlled to be small enough (e.g., from about 0.5 μm to about 100 and ranges therebetween) to target selective debonding of individual micro-chips.

The digital vision system ensures that the sample is precisely aligned with the area the laser is programmed to target (i.e., the target area of the laser). Namely, the laser is programmed to irradiate a target area. The digital vision system makes sure that the individual chip(s) 602 selected for debonding is/are, at the time of irradiating, present in that target area. This is done via the positioning adjustments made using the motorized stage to align the fiducial marks 612 by the digital cameras 702. Without the digital vision system, use of a laser having such a small spot size would be impractical since there would be no way for the laser to locate its target. Further, having a precise, controllable spot size obviates the need for a template/pattern wafer as in the example above since a spot size small enough to target individual micro-chips can be produced. As provided above, suitable laser sources for debonding include, but are not limited to, debonding include, but are not limited to, 355 nm DPSS lasers, YAG lasers, and/or excimer lasers such as XeF or XeCl excimer lasers.

The laser beam incident on the first (I') wafer will selectively ablate the release layer 606 over the individual chips 602 effectively debonding those chips from the first (I') wafer. See FIG. 9. Thus, as indicated by arrows 902, when the first wafer (I') is separated from the second (II') wafer, the selectively debonded chips 602 will remain on the flexible substrate 620, while the rest of the chips 602 remain secured to the first (I') wafer.

Figure 10:
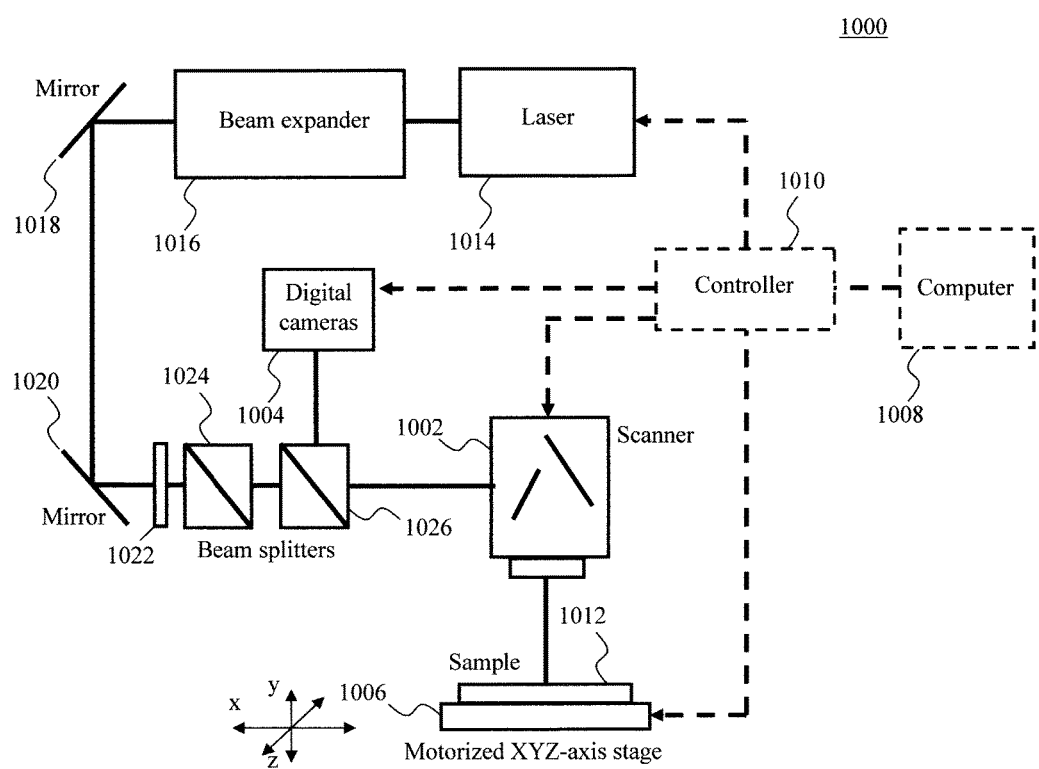
FIG. 10 is a diagram illustrating an exemplary laser debonding system according to an embodiment of the present invention.

FIG. 10 illustrates an exemplary laser debonding system 1000 that can be implemented in performing the methodology of FIGS. 6-9 as described above. System 1000 includes a high-speed optical scanner 1002, digital cameras 1004, a motorized XYZ-axis stage 1006, and a computer control system (i.e., computer 1008 and controller 1010). As described above, the digital cameras 1004 (e.g., CCD cameras), which are optically connected to the high-speed optical scanner 1002, are part of a digital vision system that is used to recognize the fiducial marks on a sample 1012 (see above) to locate the sample 1012 and thereby achieve precise alignment of the chips (see above) with the laser target area. When debonding, the laser beam moves via the optical scanner 1002 at high-speed to debond the chips. After completely scanning a chip or an area of a plurality of chips, the motorized stage 1006 will move the samples to the next target area where the next laser beam scanning starts.

A laser source 1014, optically connected to the high-speed optical scanner 1002, generates the laser beam used for the above-described laser debonding process. Suitable debonding (and bonding) laser sources were provided above. The beam passes through a beam expander 1016 which increases the beam's diameter. Depending on the arrangement of the components in the system 1000, mirrors (e.g., mirrors 1018 and 1020) can be employed where needed to route the laser beam toward the high-speed optical scanner 1002 through a lens 1022 (e.g., an F-Theta scan lens). Beam splitters 1024 and 1026 can be used to split the incident laser beam into two or more beams. As provided above, the motorized XYZ-axis stage 1006 moves the sample 1012 to the target area of the laser.

The computer 1008 coordinates the alignment process and lasing operations. Specifically, as shown in FIG. 10, the computer 1008, via controller 1010, controls the optical scanner 1002, the digital cameras 1004, the XYZ-axis stage 1006, and the laser source 1014. For example, according to the laser beam target area (e.g., defined in the computer software), the computer 1008 is used to control i) the laser source 1014 (i.e., turning the laser source 1014 on/off and controlling the corresponding laser spot size), ii) the optical scanner 1002 and the motorized XYZ-axis stage 1006 to operate the laser scanning and ablating of the bonded interface (i.e., adjusting the position of the XYZ-axis stage 1006 to align individual chips with the target area of the laser, and ii) the digital cameras 1004 (i.e., reading the image information from the digital cameras 1004 to calculate the alignment position), enabling programmable laser debonding. An exemplary apparatus that can be configured to serve as the computer 1008 is described in conjunction with the description of FIG. 22, below.

So far, the examples provided have been directed to a system and processes for laser debonding. However, embodiments are also contemplated herein where lasers, digital cameras, etc. (also referred to herein as first/second lasers, cameras, etc. for clarity) are used on both (first/second) sides of the bonded interface for sequential bonding and debonding. See, for example, FIGS. 11-20 which illustrate an exemplary chip laser bonding and debonding process. Like above, this exemplary embodiment begins with a first (I") wafer including a plurality of chips 1102 (e.g., micro-chips) bonded to a transparent handle wafer 1104 via a release layer 1106 and an adhesive layer 1108. The adhesive layer 1108 bonds to the chips 1102, and the release layer 1106 is a thin layer (e.g., having a thickness of from about 5 µm to about 10 µm, and ranges therebetween) that binds securely to the adhesive layer 1108 and the transparent handle wafer 1104, yet is later removable (by laser ablation) to fully release the chips 1102 from the transparent handle wafer 1104. Suitable adhesive and release layer materials were provided above. Each chip 1102 includes bond pads 1110 which will later be joined, via solder bonds, to corresponding contact pads on a flexible substrate during wafer reconstitution.

Figure 11:
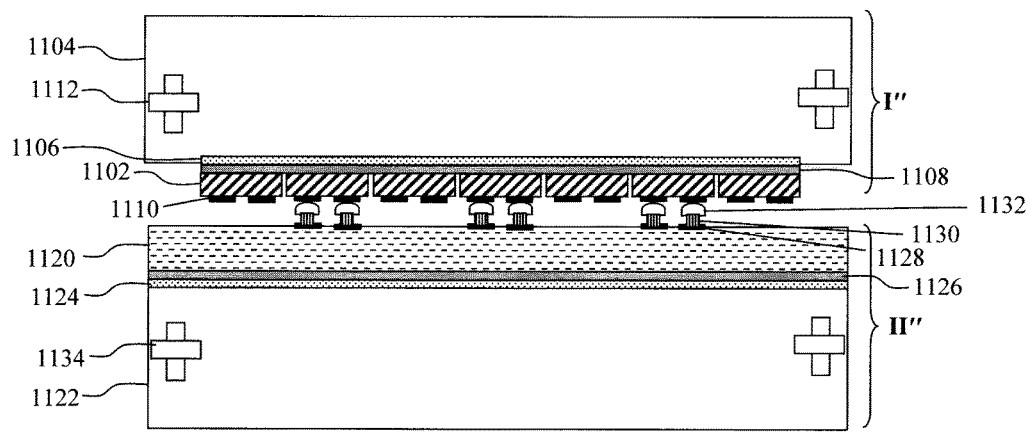
FIG. 11 is a cross-sectional diagram illustrating, according to another alternative embodiment, a first (I") wafer including a plurality of chips bonded to a transparent handle wafer having been brought in contact with a second (II") wafer including a flexible substrate bonded to a surface thereof according to an embodiment of the present invention.
Figure 12:
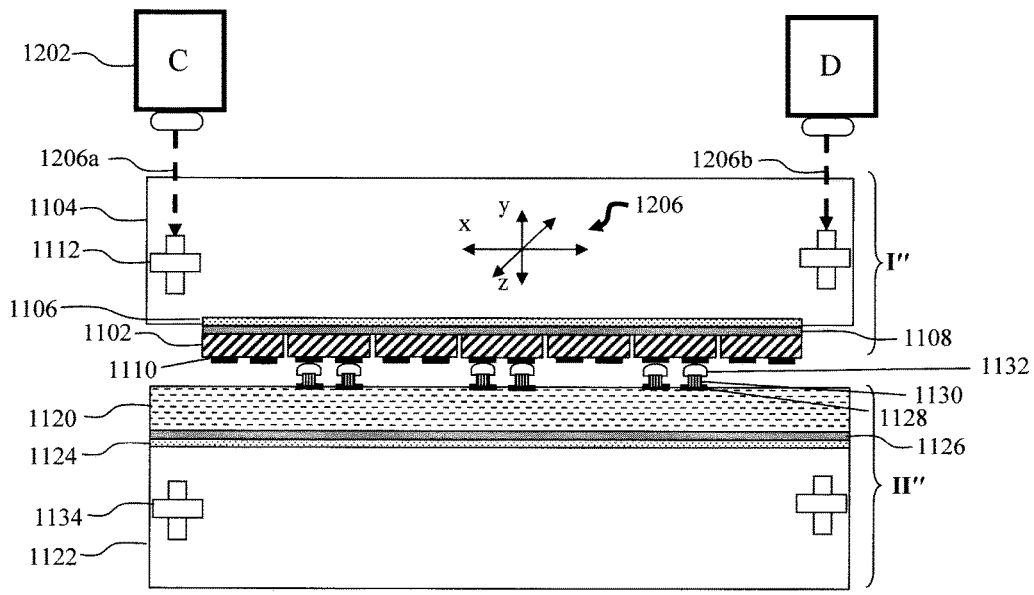
FIG. 12 is a cross-sectional diagram illustrating a digital vision system with digital cameras on both a first and a second side of the first (I") wafer/second (II") wafer, and the digital vision system having been used to align a positioning of the first (I") wafer/second (II") wafer with a laser target area for debonding according to an embodiment of the present invention.

As shown in FIG. 11, the first (I") wafer is oriented such that the chips 1102 are downward facing. Namely, after bonding the chips 1102 to the transparent handle wafer 1104, the wafer can be flipped to position the chips 1102 facing downward. In the same manner as above, the first (I") wafer is then brought in contact with a second (II") wafer component. According to an exemplary embodiment, the second (II') wafer includes a flexible substrate 1120 bonded to a handle wafer 1122. Suitable flexible substrates were provided above. According to an exemplary embodiment, the flexible substrate 1120 has a thickness of from about 30 µm to about 50 µm, and ranges therebetween. By way of example only, the handle wafer 1122 can be a glass, plastic or semiconductor handle wafer. In one exemplary embodiment, the flexible substrate 1120 is bonded to the handle wafer 1122 via a release layer 1124 and an adhesive layer 1126. Suitable adhesive and release layer materials were provided above. That way, following placement of the chips 1102 on the flexible substrate 1120, the handle wafer 1122 can then be debonded from the flexible substrate 1120 via laser ablation of the release layer 1124.

The flexible substrate 1120 has on an upper surface thereof a plurality of binding sites, namely contact pads 1128 and Cu pillar microbumps (i.e., Cu pillars 1130 and Sn-based microbumps 1132, such as Ni/Cu/Sn microbumps). Bringing the first (I") wafer in contact with the second (II") wafer aligns the Cu pillar microbumps with the contact pads 1110 on individual downward facing chips 1102.

In this exemplary embodiment, laser bonding will be performed from one side of the sample, while laser debonding is performed from the other, opposite side of the sample. Thus, the above-described digital vision system in this example employs digital cameras on both sides of the sample to precisely align the bonding and debonding lasers (each having a controlled spot size) with the individual chips 1102 by capturing images of alignment marks on the sample. Thus, as shown FIG. 11, fiducial marks 1112 are located on opposite ends of the transparent handle wafer 1104, and fiducial marks 1134 are located on opposite ends of the handle wafer 1122. The fiducial marks 1112 will be used to locate the sample for debonding, and the fiducial marks 1134 will be used to locate the sample for boding.

According to an exemplary embodiment, the digital vision system includes: i) at least two digital cameras 1202 on one (first) side of the sample, i.e., one at a location C and the other at a location D, both cameras 1102 facing downward to capture digital images of the first (I") wafer, and ii) at least two digital cameras 1204 on the (second) opposite side of the sample, i.e., one at a location E and the other at a location F, both cameras 1204 facing upward to capture digital images of the second (II") wafer. See FIG. 12. In one exemplary embodiment, the digital cameras 1202 and 1204 are CCD image sensor-based digital cameras.

The debonding and bonding will be performed sequentially and can be done in any order. For example, in one exemplary embodiment, the digital cameras 1202 are used to locate the sample via fiducial marks 1112 first for debonding. Laser debonding is then performed from one side of the sample. The digital cameras 1204 are then used to locate the sample via fiducial marks 1134 for bonding after which laser bonding is performed from the other side of the sample. Conversely, in another exemplary embodiment, the digital cameras 1204 are used to locate the sample via fiducial marks 1134 first for bonding. Laser bonding is then performed from one side of the sample. The digital cameras 1202 are then used to locate the sample via fiducial marks 1112 for debonding after which laser debonding is performed from the other side of the sample. Both scenarios will now be described.

In the case where debonding is performed first, as indicated by arrows 1206 positioning of the sample (i.e., the first (I") wafer/second (II") wafer) is adjusted (e.g., via an automated motorized stage) to align the fiducial marks 1112 (via digital cameras 1202) with the target areas of the lasers for debonding. The adjustments can be made in several different (e.g., x, y, and z) directions. According to an exemplary embodiment, the positioning of the sample is adjusted until the fiducial marks 1112 are each captured (see arrows 1206a and 1206b) by the digital cameras 1202 at locations C and D, respectively.

Figure 13:
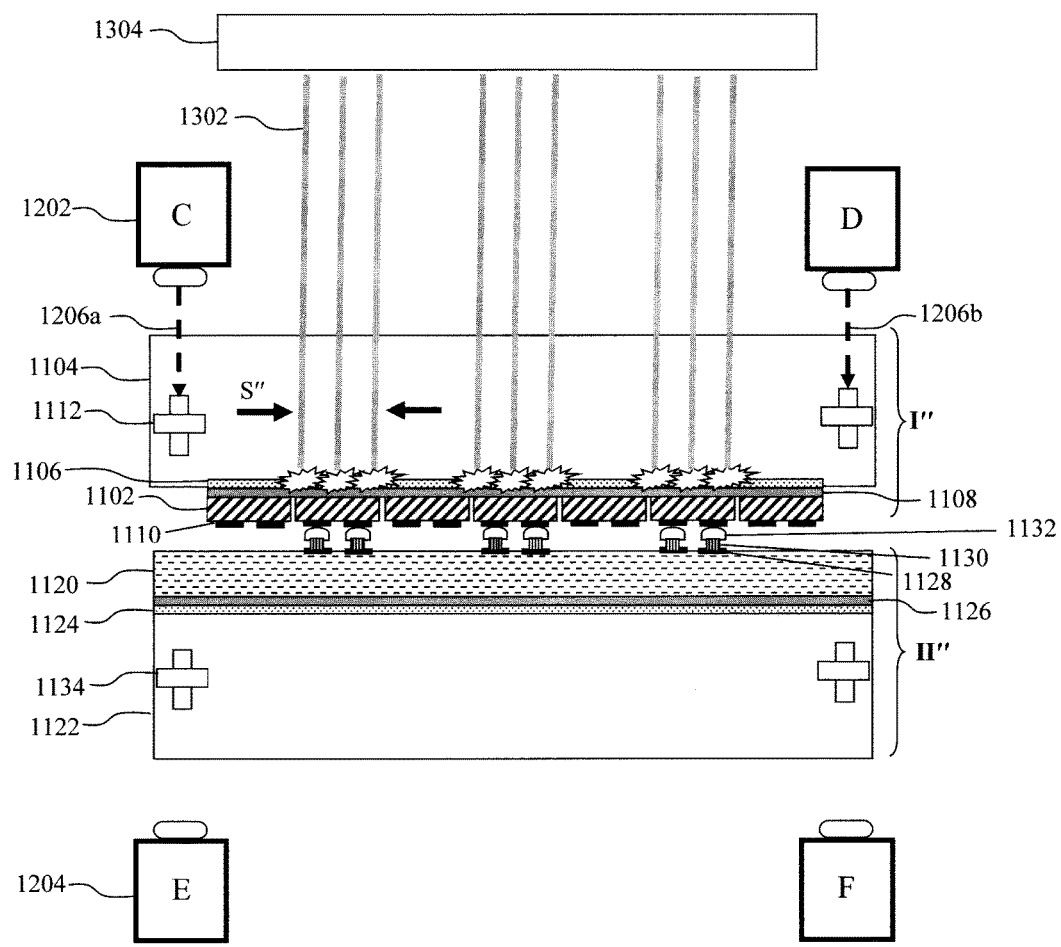
FIG. 13 is a cross-sectional diagram illustrating the first (I") wafer being irradiated via a debonding laser beam from a first laser source having a controlled spot size according to an embodiment of the present invention.
Figure 14:
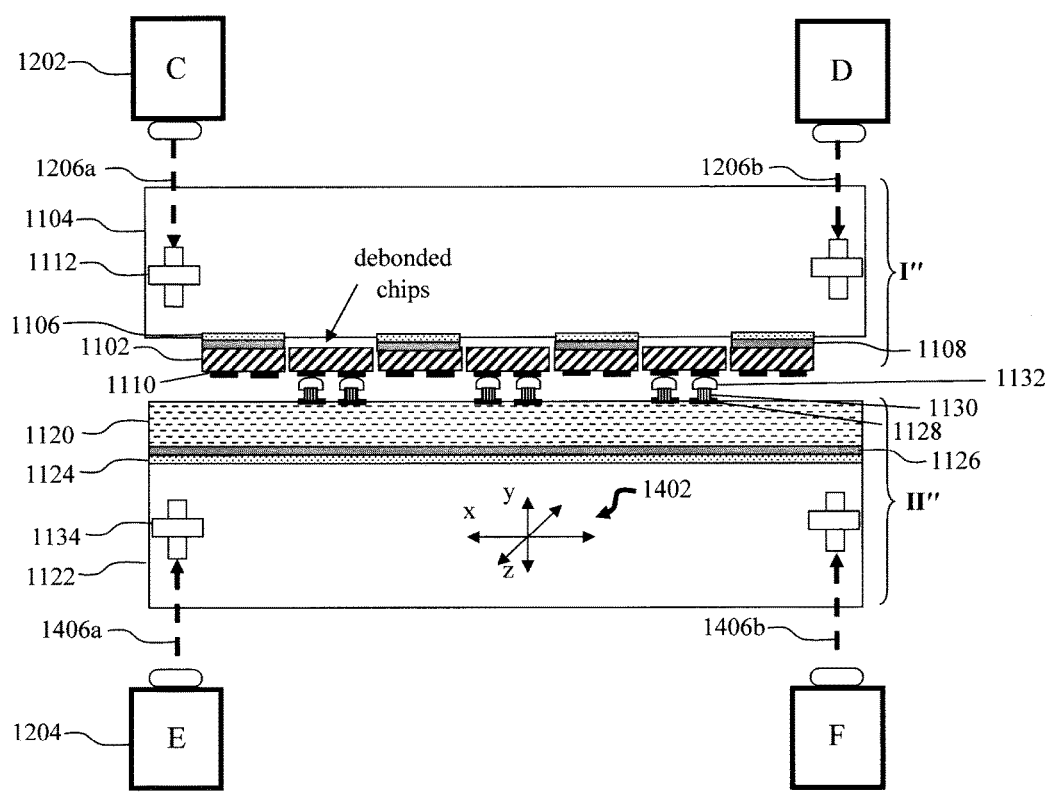
FIG. 14 is a cross-sectional diagram illustrating the digital vision system having been used to align a positioning of the first (I")/second (II") wafer with a laser target area for bonding according to an embodiment of the present invention.

As shown in FIG. 13, the first (I") wafer is then irradiated via a laser beam 1302 from a laser source 1304. According to an exemplary embodiment, the laser beam spot size S" is controlled to be small enough (e.g., from about 0.5 µm to about 100 and ranges therebetween) to target selective debonding of individual micro-chips. As provided above, suitable laser sources 1304 for debonding include, but are not limited to, debonding include, but are not limited to, 355 nm DPSS lasers, YAG lasers, and/or excimer lasers such as XeF or XeCl excimer lasers. The laser beam incident on the first (I") wafer will selectively ablate the release layer 1106 over the individual chips 1102 effectively debonding those chips from the first (I") wafer.

The process is then repeated on the opposite side of the sample, this time to bond/attach the (now debonded) chips 1102 to the flexible substrate 1120. For instance, as indicated by arrows 1402 positioning of the sample (i.e., the first (I") wafer/second (II") wafer) is adjusted (e.g., via an automated motorized stage) to align the fiducial marks 1134 (via digital cameras 1204) with the target areas of the laser for bonding. See FIG. 14. The adjustments can be made in several different (e.g., x, y, and z) directions. According to an exemplary embodiment, the positioning of the sample is adjusted until the fiducial marks 1134 are each captured (see arrows 1406a and 1406b) by the digital cameras 1204 at locations E and F, respectively.

Figure 15:
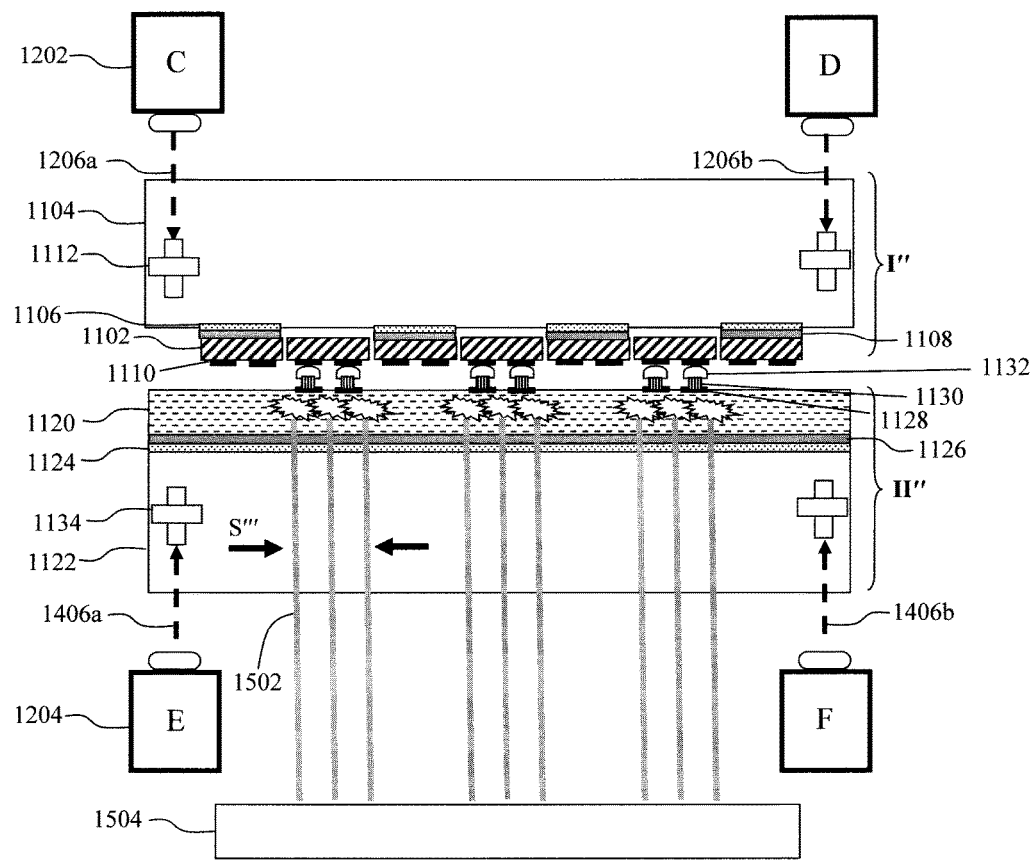
FIG. 15 is a cross-sectional diagram illustrating the first (I") wafer being irradiated via a bonding laser beam from a second laser source having a controlled spot size according to an embodiment of the present invention.
Figure 16:
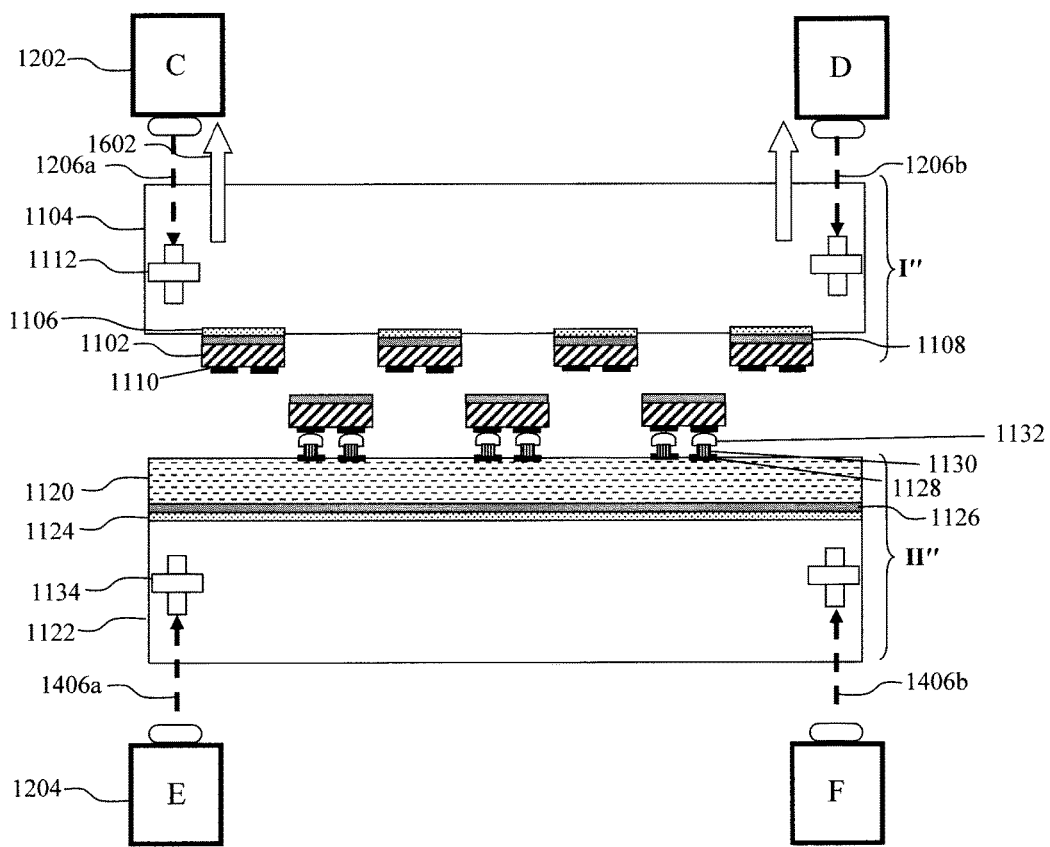
FIG. 16 is a cross-sectional diagram illustrating the first (I") wafer having been separated from the second (II") wafer with the selectively debonded chips remaining on the flexible substrate according to an embodiment of the present invention.

As shown in FIG. 15, the second (II") wafer is then irradiated via a laser beam 1502 from a laser source 1504. According to an exemplary embodiment, the laser beam spot size S'" is controlled to be small enough (e.g., from about 0.5 µm to about 100 µm, and ranges therebetween) to target selective bonding of individual micro-chips. The notion here is that the laser beam 1502 will locally heat and reflow solder microbumps 1132 of the debonded chips 1102 forming a bond with the Cu micropillars on the flexible substrate 1120. As provided above, suitable laser sources 1504 for bonding include, but are not limited to, a near-IR laser (800 nm). Thus, as indicated by arrows 1602, when the first wafer (I') is separated from the second (II') wafer, the selectively debonded chips 1102 will remain on the flexible substrate 1120, while the rest of the chips 602 remain secured to the first (I') wafer. See FIG. 16.

Figure 17:
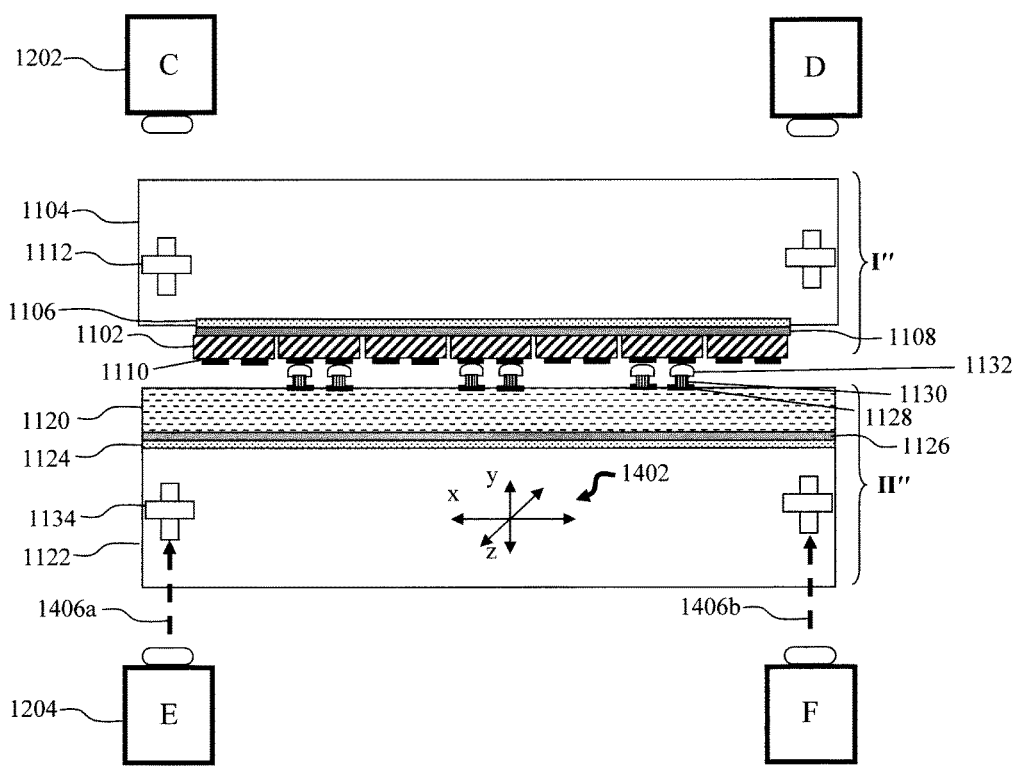
FIG. 17 is a cross-sectional diagram illustrating, according to yet another alternative embodiment where bonding is performed before debonding, the digital vision system having been used to align a positioning of the first (I") wafer/ second (II") wafer with the laser target area for bonding according to an embodiment of the present invention.

As provided above, the bonding and debonding can be performed sequentially in any order. Thus, for completeness, FIGS. 17-20 illustrate the above-described bonding/debonding process where the bonding is performed first, followed by the debonding. The same steps are performed as above, in the same manner, except that the order of the bonding/debonding steps are reversed. Thus, following from FIG. 11, as shown in FIG. 17 arrows 1402 indicate that the positioning of the sample (i.e., the first (I") wafer/second (II") wafer) is adjusted (e.g., via an automated motorized stage) to align the fiducial marks 1134 (via digital cameras 1204) with the target areas of the laser for bonding. As described above, the positioning of the sample is adjusted until the fiducial marks 1134 are each captured (see arrows 1406a and 1406b) by the digital cameras 1204 at locations E and F, respectively.

Figure 18:
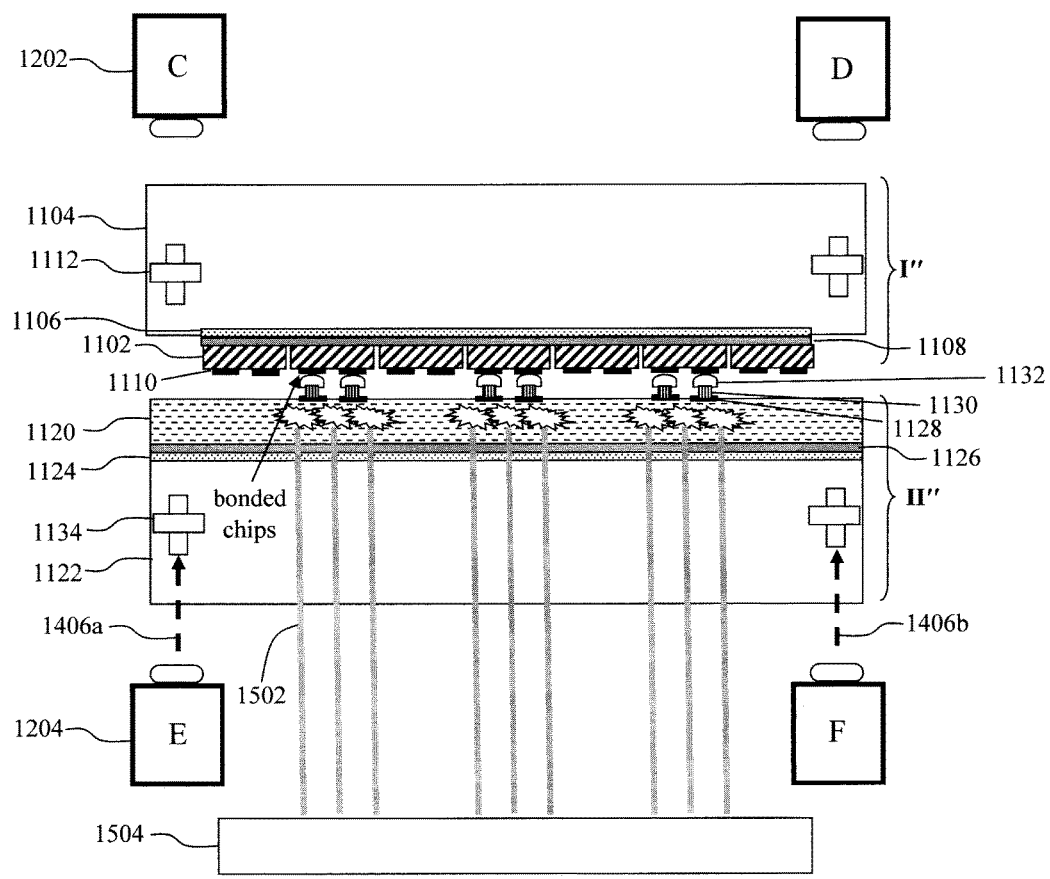
FIG. 18 is a cross-sectional diagram illustrating the first (I") wafer being irradiated via a bonding laser beam from the second laser source having a controlled spot size according to an embodiment of the present invention.
Figure 19:
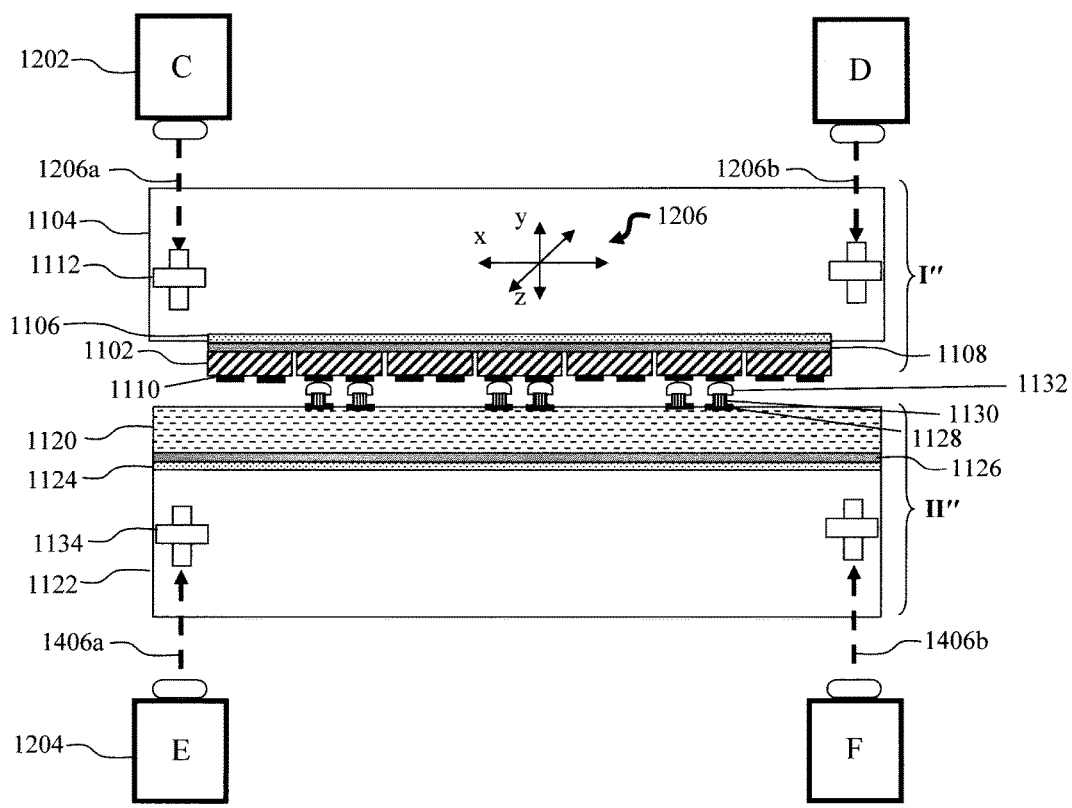
FIG. 19 is a cross-sectional diagram illustrating the digital vision system having been used to align a positioning of the first (I") wafer/second (II") wafer with the laser target area for debonding according to an embodiment of the present invention.

As shown in FIG. 18, the second (II") wafer is then irradiated via a laser beam 1502 from a laser source 1504 (e.g., a near-IR laser) having a spot size, for example, of from about 0.5 µm to about 100 µm, and ranges therebetween to target the selective bonding of individual micro-chips. The notion here is that the laser beam 1502 will locally heat and reflow solder microbumps 1132 of the chips 1102 forming a bond with the Cu micropillars on the flexible substrate 1120.

As indicated by arrows 1206 positioning of the sample (i.e., the first (I") wafer/second (II") wafer) is adjusted (e.g., via an automated motorized stage) to align the fiducial marks 1112 (via digital cameras 1202) with the target areas of the lasers for debonding. See FIG. 19. As above, the positioning of the sample is adjusted until the fiducial marks 1112 are each captured (see arrows 1206a and 1206b) by the digital cameras 1202 at locations C and D, respectively.

Figure 20:
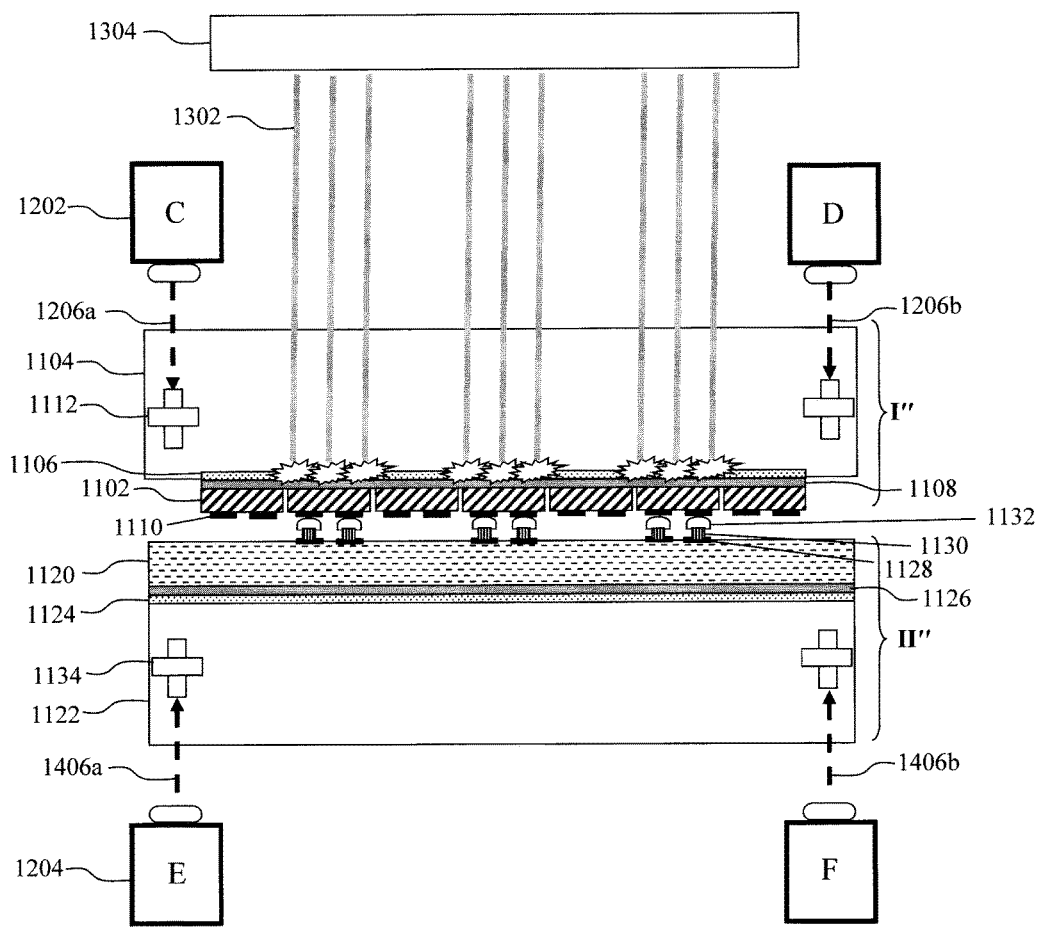
FIG. 20 is a cross-sectional diagram illustrating the first (I") wafer being irradiated via a debonding laser beam from the first laser source having a controlled spot size according to an embodiment of the present invention.

As shown in FIG. 20, the first (I") wafer is then irradiated via a laser beam 1302 having a spot size of, for example, of from about 0.5 µm to about 100 µm, and ranges therebetween to target selective debonding of individual micro-chips from a laser source 1304 (e.g., a 355 nm DPSS laser, YAG laser, and/or excimer laser such as an XeF or XeCl excimer laser). The laser beam incident on the first (I") wafer will selectively ablate the release layer 1106 over the individual chips 1102 effectively debonding those chips from the first (I") wafer.

Figure 21:
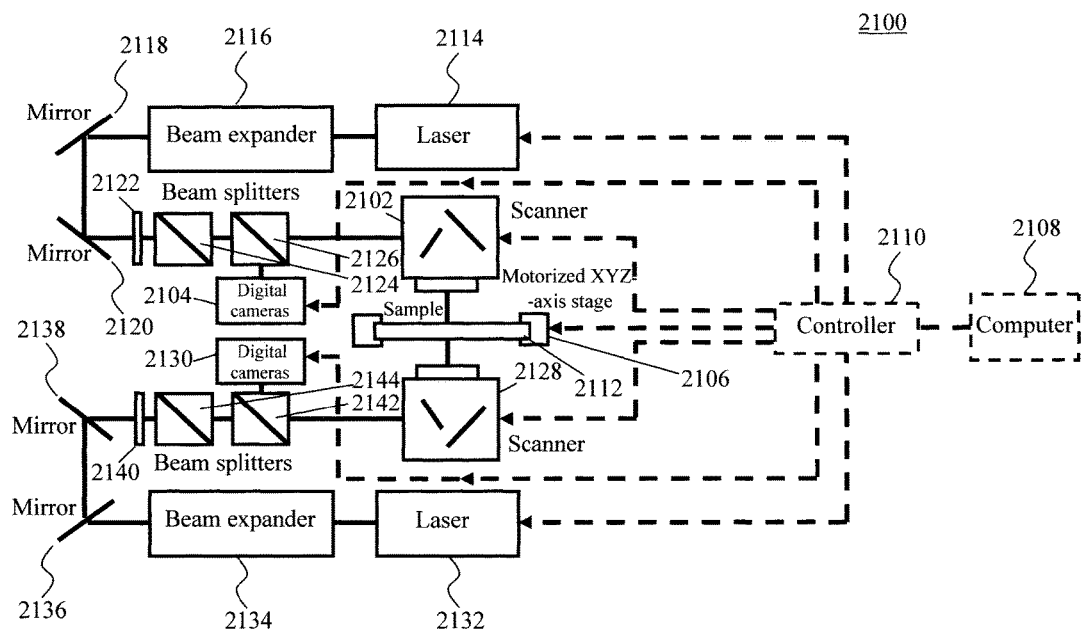
FIG. 21 is a diagram illustrating an exemplary laser bonding and debonding system according to an embodiment of the present invention.

FIG. 21 illustrates an exemplary laser bonding and debonding system 2100 that can be implemented in methodologies of FIGS. 11-20 for performing bonding/debonding (or vice versa) operations from opposite sides of the sample as described above. According to an exemplary embodiment, system 2100 implements the same basic components as system 1000 (described in conjunction with the description of FIG. 10 above) in duplicate on opposite sides of the sample with the proper laser sources being selected for their bonding and debonding operations. In the example depicted in FIG. 21, debonding is performed from the top of the sample and bonding is performed from the bottom of the sample. Of course, these functions can be reversed in practice, if so desired.

For laser debonding, system 2100 includes a high-speed optical scanner 2102, digital cameras 2104, a motorized XYZ-axis stage 2106, and a computer control system (i.e., computer 2108 and controller 2110). It is notable that the a motorized XYZ-axis stage 2106 and computer control system are common components to the laser debonding and bonding systems. As described above, the digital cameras 2104 (e.g., CCD cameras), which are optically connected to the high-speed optical scanner 2102, are part of a digital vision system that is used to recognize the fiducial marks on a sample 2112 (see above) to locate the sample 2112 and thereby achieve precise alignment of the chips (see above) with the laser target area.

A laser source 2114, optically connected to the high-speed optical scanner 2102, generates the laser beam used for the above-described laser debonding process. As provided above, suitable laser sources for laser debonding include, but are not limited to, 355 nm DPSS lasers, YAG lasers, and/or excimer lasers such as XeF or XeCl excimer lasers. The beam passes through a beam expander 2116 which increases the beam's diameter. Depending on the arrangement of the components in the system 2100, mirrors (e.g., mirrors 2118 and 2120) can be employed where needed to route the laser beam toward the high-speed optical scanner 2102 through a lens 2122 (e.g., an F-Theta scan lens). Beam splitters 2124 and 2126 can be used to split the incident laser beam. As provided above, the motorized XYZ-axis stage 2106 moves the sample 2112 to the target area of the debonding laser.

The computer 2108 coordinates the alignment process and lasing operations. Specifically, as shown in FIG. 21, the computer 2108, via controller 2110, controls the optical scanner 2102, the digital cameras 2104, the XYZ-axis stage 2106, and the laser source 2114. For example, according to the laser beam target area (e.g., defined in the computer software), the computer 1008 is used to control i) the laser source 2114 (i.e., turning the laser source 2114 on/off and controlling the corresponding laser spot size), ii) the optical scanner 2102 and the motorized XYZ-axis stage 2106 to operate the laser scanning and ablating of the bonded interface (i.e., adjusting the position of the XYZ-axis stage 2106 to align individual chips with the target area of the laser, and ii) the digital cameras 2104 (i.e., reading the image information from the digital cameras 2104 to calculate the alignment position), enabling programmable laser debonding.

For laser bonding, system 2100 includes a high-speed optical scanner 2128, digital cameras 2130, and the motorized XYZ-axis stage 2106/computer control system (which are common components for the laser debonding and bonding systems). As described above, the digital cameras 2130 (e.g., CCD cameras), which are optically connected to the high-speed optical scanner 2128, are part of a digital vision system that is used to recognize the fiducial marks on the sample 2112 (see above) to locate the sample 2112 and thereby achieve precise alignment of the chips (see above) with the laser target area.

A laser source 2132, optically connected to the high-speed optical scanner 2128, generates the laser beam used for the above-described laser bonding process. As provided above, suitable laser sources for laser bonding include, but are not limited to, a near-IR laser (800 nm). The beam passes through a beam expander 2134 which increases the beam's diameter. Depending on the arrangement of the components in the system 2100, mirrors (e.g., mirrors 2136 and 2138) can be employed where needed to route the laser beam toward the high-speed optical scanner 2128 through a lens 2140 (e.g., an F-Theta scan lens). Beam splitters 2142 and 2144 can be used to split the incident laser beam. As provided above, the motorized XYZ-axis stage 2106 moves the sample 2112 to the target area of the bonding laser.

The computer 2108 coordinates the alignment process and lasing operations. Specifically, as shown in FIG. 21, the computer 2108, via controller 2110, controls the optical scanner 2128, the digital cameras 2130, the XYZ-axis stage 2106, and the laser source 2132. For example, according to the laser beam target area (e.g., defined in the computer software), the computer 2108 is used to control i) the laser source 2132 (i.e., turning the laser source 2132 on/off and controlling the corresponding laser spot size), ii) the optical scanner 2128 and the motorized XYZ-axis stage 2106 to operate the laser scanning and ablating of the bonded interface (i.e., adjusting the position of the XYZ-axis stage 2106 to align individual chips with the target area of the laser, and ii) the digital cameras 2130 (i.e., reading the image information from the digital cameras 2130 to calculate the alignment position), enabling programmable laser debonding.

Figure 22:
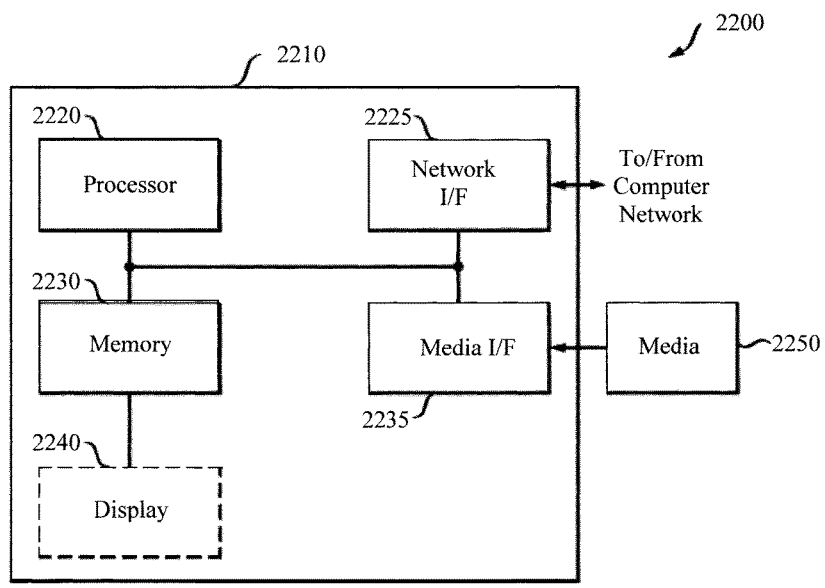
FIG. 22 is a diagram illustrating an exemplary apparatus that can be configured to implement one or more of the methodologies presented herein according to an embodiment of the present invention.

Turning now to FIG. 22, a block diagram is shown of an apparatus 2200 that can be configured to perform one or more of the methodologies described herein. For example, apparatus 2200 can be configured to serve as computer 1008 and/or computer 2108 in system 1000 (FIG. 10) and/or system 2100 (FIG. 21), respectively. Apparatus 2200 includes a computer system 2210 and removable media 2250. Computer system 2210 includes a processor device 2220, a network interface 2225, a memory 2230, a media interface 2235 and an optional display 2240. Network interface 2225 allows computer system 2210 to connect to a network, while media interface 2235 allows computer system 2210 to interact with media, such as a hard drive or removable media 2250.

Processor device 2220 can be configured to implement the methods, steps, and functions disclosed herein. The memory 2230 could be distributed or local and the processor device 2220 could be distributed or singular. The memory 2230 could be implemented as an electrical, magnetic or optical memory, or any combination of these or other types of storage devices. Moreover, the term "memory" should be construed broadly enough to encompass any information able to be read from, or written to, an address in the addressable space accessed by processor device 2220. With this definition, information on a network, accessible through network interface 2225, is still within memory 2230 because the processor device 2220 can retrieve the information from the network. It should be noted that each distributed processor that makes up processor device 2220 generally contains its own addressable memory space. It should also be noted that some or all of computer system 2210 can be incorporated into an application-specific or general-use integrated circuit.

Optional display 2240 is any type of display suitable for interacting with a human user of apparatus 2200. Generally, display 2240 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method, comprising:
providing a first wafer comprising chips bonded to a surface thereof;
contacting the first wafer with a second wafer, the second wafer comprising a substrate bonded to a surface thereof, wherein the contacting aligns individual chips with bonding sites on the substrate; and
debonding the individual chips from the first wafer using a debonding laser having a small spot size of about 0.5 µm to about 100 µm, and ranges therebetween.

2. The method of claim 1, wherein the first wafer is oriented with the chips facing downward.

3. The method of claim 1, further comprising:
positioning a third wafer over the first wafer, the third wafer comprising a pattern having openings therein over the individual chips which are targeted for debonding; and
irradiating the first wafer with the debonding laser through the pattern creating the small spot size to selectively debond the individual chips from the first wafer.

4. The method of claim 1, wherein the first wafer and the second wafer are present on a motorized XYZ-axis stage, the method further comprising the step of:
adjusting a positioning of the first wafer and the second wafer to align the individual chips with a target area of the debonding laser.

5. The method of claim 1, wherein the chips comprise micro-chips having dimensions less than 100 µm×100 µm.

6. The method of claim 1, wherein the chips are bonded to the surface of the first wafer via a release layer and an adhesive layer, wherein the release layer is disposed on the first wafer, the adhesive layer is disposed on the release layer, and the chips are disposed on the adhesive layer, and wherein the debonding comprises ablating the release layer at the individual chips using the debonding laser.

7. The method of claim 6, wherein the release layer comprises a material selected from the group consisting of: benzocyclobutene (BCB), polyimide-based adhesives, polyimide-based materials, inert underlayer (UL) films, spin-on carbon (SOC) films, organic planarizing layer (OPL), and combinations thereof.

8. The method of claim 6, wherein the release layer has a thickness of from about 5 µm to about 10 µm, and ranges therebetween.

9. The method of claim 6, wherein the adhesive layer comprises a material selected from the group consisting of: polyimide-based adhesives, thermalplastic adhesives, Benzocyclobutene (BCB), Polymethylmethacrylate (PMMA), Polydimethylsiloxane (PDMS), and combinations thereof.

10. The method of claim 1, wherein the substrate comprises a material selected from the group consisting of: a glass substrate, a polymer substrate, a polyimide substrate, a ceramic substrate, and combinations thereof.

11. The method of claim 6, wherein the substrate has a thickness of from about 30 µm to about 50 µm, and ranges therebetween.

12. The method of claim 1, wherein the binding sites comprise tin (Sn)-based microbumps.

13. The method of claim 1, wherein the debonding laser is produced by a laser source selected from the group consisting of: a 355 nm diode-pumped solid state (DPSS) laser, an yttrium aluminum garnet (YAG) laser, a xenon fluoride (XeF) excimer laser, a xenon chloride (XeCl) excimer laser, a near-infrared (IR) laser, and combinations thereof.

14. The method of claim 1, further comprising:
bonding the individual chips to the bonding sites on the substrate using a bonding laser.

15. The method of claim 14, wherein the bonding laser is produced by a laser source selected from the group consisting of: a 355 nm DPSS laser, a YAG laser, a XeF excimer laser, a XeCl excimer laser, a near-IR laser, and combinations thereof.

16. The method of claim 14, wherein the first wafer and the second wafer are present on a motorized XYZ-axis stage, the method further comprising the step of:
adjusting a positioning of the first wafer and the second wafer to align the individual chips with a target area of the bonding laser.

* * * * *